United States Patent [19]

Matsuda et al.

[11] Patent Number: 5,279,681
[45] Date of Patent: Jan. 18, 1994

[54] PHOTOVOLTAIC DEVICE WITH LAYER REGION CONTAINING GERMANIUM THERIN

[75] Inventors: Koichi Matsuda; Tsutomu Murakami; Jinsho Matsuyama; Naoto Okada; Toshihiro Yamashita, all of Nagahama, Japan

[73] Assignee: Canon Kabushiki Kaisha, Tokyo, Japan

[21] Appl. No.: 838,101

[22] Filed: Feb. 20, 1992

[30] Foreign Application Priority Data

Feb. 20, 1991 [JP] Japan .................. 3-045588

[51] Int. Cl.⁵ .......................... H01L 31/075
[52] U.S. Cl. ........................ 136/255; 136/258; 257/458
[58] Field of Search ............... 136/255, 258 AM, 261; 257/458

[56] References Cited

U.S. PATENT DOCUMENTS

| | | | |
|---|---|---|---|
| 4,254,429 | 3/1981 | Yamazaki | 357/16 |
| 4,542,256 | 9/1988 | Wiedman | 136/249 TJ |
| 4,816,082 | 3/1989 | Guha | 136/249 TJ |
| 4,959,106 | 9/1990 | Nakagawa et al. | 136/258 PC |
| 5,002,617 | 3/1991 | Kanai et al. | 136/258 PC |
| 5,002,618 | 3/1991 | Kanai et al. | 136/258 PC |
| 5,006,180 | 4/1991 | Kanai et al. | 136/158 PC |
| 5,007,971 | 4/1991 | Kanai et al. | 136/258 PC |
| 5,016,565 | 5/1991 | Saitoh et al. | 118/723 |
| 5,028,488 | 7/1991 | Nakagawa et al. | 428/457 |
| 5,104,455 | 4/1992 | Yokota et al. | 136/249 TJ |

FOREIGN PATENT DOCUMENTS

| | | | |
|---|---|---|---|
| 0178639 | 4/1986 | European Pat. Off. | 136/258 AM |
| 0213622 | 11/1987 | European Pat. Off. | 136/258 AM |
| 0304145 | 2/1989 | European Pat. Off. | 136/249 TJ |
| 58-98988 | 6/1983 | Japan | 136/258 AM |
| 58-106876 | 6/1983 | Japan | 136/258 AM |

OTHER PUBLICATIONS

Japanese Journal of Applied Physics, vol. 26, No. 7, Jul. 1987, pp. 1107–1111, S. Yamanaka et al., "High-Performance Hydrogenated Amorphous Silicon-Germanium Solar Cells Fabricated By Photochemical Vapor Deposition."

Primary Examiner—Aaron Weisstuch
Attorney, Agent, or Firm—Fitzpatrick, Cella, Harper & Scinto

[57] ABSTRACT

A photovoltaic device having a semiconductor body with a pin junction, with reduced time-dependent deterioration, high reliability and a high photoelectric conversion efficiency is disclosed.

An i-type semiconductor layer constituting the semiconductor body is composed of a layer having a region containing germanium and at least one region not containing germanium. The at least one region not containing germanium is provided at least at the side of a p-semiconductor layer. The maximum composition ratio of germanium in the region containing amorphous silicon and germanium is within a range from 20 to 70 at. %, and the composition ratio of germanium in the above-mentioned region containing amorphous silicon and germanium is zero at the side of an n-semiconductor layer and increases toward the side of the p-semiconductor layer, with the rate of increase being larger at the side of the n-semiconductor layer than at the side of p-semiconductor layer, and the composition ratio of germanium at the center of the i-layer thickness is at least equal to 75 at. % of the maximum composition ratio of germanium.

2 Claims, 14 Drawing Sheets

FIG. IA
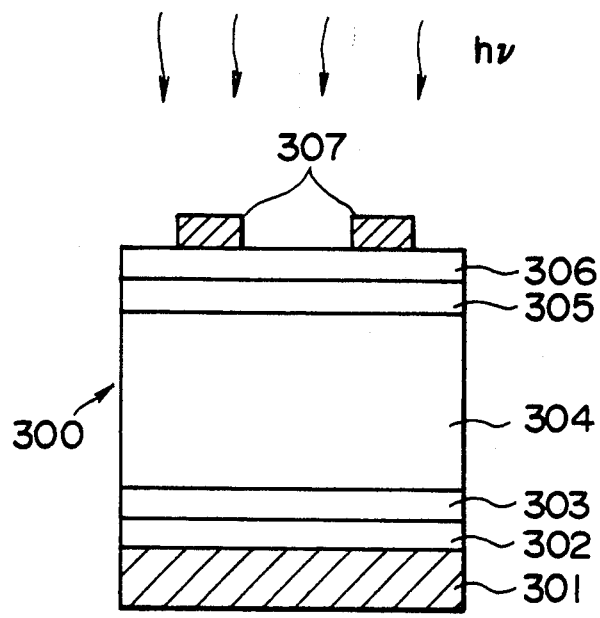
FIG. IB
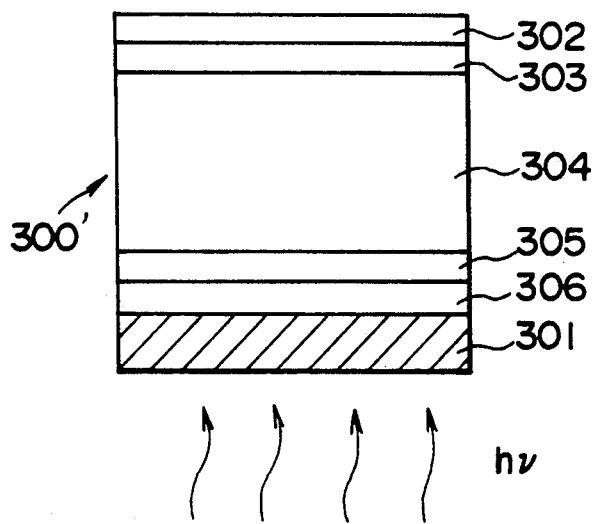

F I G. 4
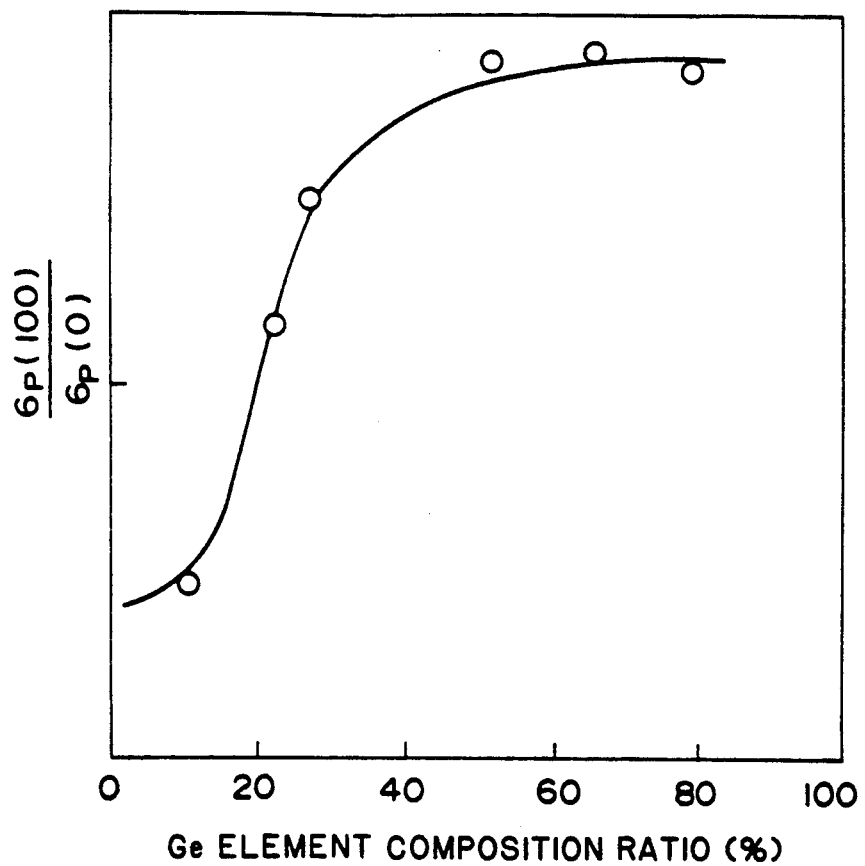

PHOTOVOLTAIC DEVICE WITH LAYER REGION CONTAINING GERMANIUM THERIN

BACKGROUND OF THE INVENTION

1. Field of the Invention

The present invention relates to a photovoltaic device with a region containing germanium therein, with a high photoelectric conversion efficiency and a high reliability, adapted for use as a solar cell or the like.

2. Related Background Art

The solar cell, a photoelectric converting device for converting sunlight into electric energy, is already widely used as a small power source in various consumer products such as desk-top calculators and wrist watches, and is considered as a promising technology as a substitute for the so-called fossil fuels such as petroleum and coal. The solar cell relies on the photovoltaic force generated by a semiconductor p-n junction, and is based on the principle of generating photocarriers, namely electrons and positive holes by the absorption of sunlight by a semiconductor such as silicon, causing said photocarriers to drift by the internal electric field of the p-n junction and outputting said photocarriers to an external load Such solar cells can be prepared substantially through a semiconductor manufacturing process. More specifically, the p-n junction is obtained by preparing a monocrystalline silicon ingot doped to p- or n-conductivity type by a crystal growing method such as the CZ method, slicing the obtained single crystal ingot to prepare a silicon wafer of a thickness of about 300 μm, and forming a layer of a conductivity type different from that of said wafer, for example, by diffusion of a valence electron controlling material.

The currently commercialized solar cells are principally based on monocrystalline silicon in consideration of their reliability and conversion efficiency, but the production cost is high because of the semiconductor process employed in the preparation. Such monocrystalline silicon solar cells are also associated with other drawbacks; for example, they require a thickness of at least 50 μm because monocrystalline silicon has a low light absorption coefficient because of an indirect band gap transition, and they are unable to effectively utilize short wavelength components because the band gap is about 1.1 eV, which is narrower than 1.5 eV, which is desirable for solar cells. The use of polycrystalline silicon may reduce the production cost, but the problem of indirect band gap transition still remains, so that the thickness of the solar cell cannot be reduced. Besides, polycrystalline silicon is associated with other problems, such as those resulting from crystal grain boundaries.

Furthermore, the cost per unit amount of generated electric power becomes higher than in the conventional power generating methods, because wiring for serial or parallel connection of unit devices is required for obtaining a large electric power, as large-sized wafers are difficult to prepare with the crystalline material, and because expensive instrumentation is required for protecting the solar cells from mechanical damages resulting from various climates they are subjected to in outdoor use. In development of solar cells for large power generation, therefore, cost reduction and device area extension are important issues, and investigations are being made for materials of lower cost or higher conversion efficiency. Examples of such material for solar cells include tetrahedrally bonded amorphous semiconductors such as amorphous silicon or amorphous silicon-germanium, II-VI compound semiconductors such as CdS, and Group III-V compound semiconductors such as GaAs or GaAlAs. Particularly, a thin film solar cell employing an amorphous semiconductor in the photovoltaic layer is considered promising because it can be prepared in a larger area, with a smaller thickness, and on an arbitrary substrate, in comparison with the monocrystalline solar cell.

However, such solar cells employing amorphous semiconductors still require improvement in the photoelectric conversion efficiency and reliability. A method for improving the photoelectric conversion efficiency is to reduce the band gap, thereby increasing the sensitivity for the light of the longer wavelength region. Since amorphous silicon, with a band gap of ca. 1 7 eV, cannot absorb and utilize the light of a wavelength of 700 nm or longer, there have been investigated materials of a narrower band gap, sensitive to the light of such longer wavelength region. An example of such materials is amorphous silicon-germanium, of which the band gap is arbitrarily variable from 1.3 to 1.7 eV by a change in the ratio of silicon-containing gas and germanium-containing gas employed during film formation.

Another method for improving the photoelectric conversion efficiency of the solar cell is based on the use of a tandem cell in which plural unit solar cells are laminated, as disclosed in U.S. Pat. No. 2,949,498. Said tandem cell, originally applied to crystalline semiconductors including a p-n junction, achieves improvement in the power generating efficiency by efficiently absorbing the solar spectrum with photovoltaic devices of different band gaps, thereby increasing $V_{oc}$, and this principle is likewise applicable to an amorphous or crystalline material. In said tandem solar cell, the devices of different band gaps are stacked to efficiently absorb different regions of the solar spectrum in order to increase the energy conversion efficiency. The so-called top cell, positioned at the light entrance side of the stacked devices, is designed to have a wider band gap than the so-called bottom cell, positioned under said top cell. In the case of the two-layer tandem cell, the top and bottom cells are respectively composed of amorphous silicon and amorphous silicon-germanium, as a preferred combination of materials.

Another drawback of solar cells based on amorphous semiconductors is deterioration of conversion efficiency, caused by light irradiation. This phenomenon is caused by lowered carrier drift-mobility resulting from deterioration of the film quality of amorphous silicon or amorphous silicon alloys by light irradiation, and is known as the Staebler-Wronski effect, specific to amorphous semiconductors. This phenomenon leads to a lack of reliability in large power applications, and is a major obstacle to the commercial use of such solar cells. Therefore, intensive efforts are being conducted for avoiding such photodeterioration of amorphous semiconductors, by improvements in the film quality and in the cell structure. The use of the above-mentioned tandem cell structure is an effective method for avoiding such drawbacks, and it has been confirmed that the deterioration of cell characteristics by light irradiation is reduced by a reduction in the free path of carriers through the use of a thinner intrinsic layer.

However, further improvement in the reliability of amorphous silicon solar cells is still required, as the drawback of photodeterioration has not completely been resolved, despite continued efforts for clarifying the mechanism thereof and avoiding such photodeterioration. The maximum efficiency in such tandem cells can be obtained by so-called current matching, in which the currents obtained by the different cells are made equal. A bottom cell composed of amorphous silicon-germanium can sufficiently absorb the light even with a small thickness because the band gap thereof is smaller than that of the top cell composed of amorphous silicon, but efficient power generation becomes impossible because of an imbalance between the top cell and the bottom cell after prolonged light irradiation, because the deterioration rate of the amorphous silicon-germanium constituting the bottom cell is larger than that of the amorphous silicon constituting the top cell. While in such stacked cell, the use of a thinner intrinsic layer is effective for preventing the photodeterioration because the light absorption of the entire device is reduced, it, however, leads to a decreased initial photovoltaic force. Thus, a photovoltaic device meeting the requirements of high reliability and high efficiency at the same time has not been realized.

SUMMARY OF THE INVENTION

The object of the present invention is to resolve the drawbacks mentioned above and to provide a solar cell of high reliability and a high photoelectric conversion efficiency.

The present inventors have developed the photovoltaic device of the present invention, based on findings that a film of satisfactory quality with a reduced decrease of conductivity and an extremely low increase of defects in said film under continuous light irradiation, can be obtained by controlling the stoichiometric ratio of silicon-containing gas and germanium-containing gas employed in film formation, and that a solar cell with improved initial efficiency can be obtained by control of the composition ratio of silicon and germanium in the direction of film thickness in the amorphous silicon-germanium region.

The present invention is characterized by a photovoltaic device with at least a set of PIN semiconductor layers, wherein the I-semiconductor layer in said PIN layers is composed of a germanium-free layer region and a germanium-containing region; said germanium-free region being provided at least at the side of the P-type semiconductor layer; the maximum composition ratio (in percent) of germanium in said germanium-containing amorphous silicon region is within a range of 20 to 70 at. %; the composition ratio of germanium in said germanium-containing amorphous silicon region is zero at the side of the N-semiconductor layer and increases toward the P-semiconductor layer; and the rate of said increase is larger at the side of the P-type semiconductor layer than at the side of the N-type semiconductor layer, in such a manner that the composition ratio of germanium at the center of the film thickness is equal to or larger than 75% of the maximum composition ratio of germanium.

BRIEF DESCRIPTION OF THE DRAWINGS

FIGS. 1A and 1B are schematic cross-sectional views of photovoltaic devices of the present invention;

FIG. 4 is a graph showing the relation between the composition ratio of germanium in the i-semiconductor layer of the photovoltaic device and the time-dependent change in photoconductivity;

DETAILED DESCRIPTION OF THE PREFERRED EMBODIMENTS

Figure 2A:
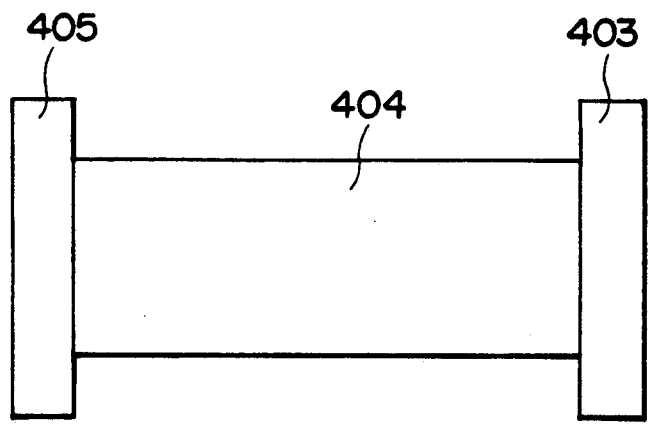
FIGS. 2A, 2B, and 2C are schematic views showing the energy band profile of the photovoltaic device.

Now the present invention will be clarified by embodiments thereof shown in the attached drawings. However, the photovoltaic device of the present invention is not limited by such embodiments but may be constructed in any manner so as to attain the object of the present invention.

FIGS. 1A and 1B illustrate amorphous semiconductor pin type solar cells, adapted for application to the photovoltaic device of the present invention and respectively designed to receive sunlight from above and from below. There are shown a main body 300, 300' of the solar cell; a substrate 301; a lower electrode 302; an n-semiconductor layer 303; an i-semiconductor layer 304; a p-semiconductor layer 305; an upper electrode 306; and a current-collecting electrode 307. The structure of these photovoltaic devices will be explained in the following:

Substrate

The semiconductor layers 303, 304, 305, being of a thickness of about 1 μm, are deposited on a suitable substrate 301 which can be monocrystalline or non-monocrystalline, and conductive or insulating. It can further be translucent or opaque, but is preferably provided with a desired strength with limited deformation or distortion. Specific examples of such substrate include a thin plate or a composite of metals such as Fe, Ni, Cr, Al, Mo, Au, Nb, Ta, V, Ti, Pt, Pb, and alloys thereof such as brass or stainless steel; a film or a sheet of heat-resistant resin such as polyester, polyethylene, polycarbonate, cellulose acetate, polypropylene, polyvinyl chloride, polyvinylidene chloride, polystyrene, polyamide, polyimide, or epoxy resin and a composite material thereof with glass fibers, carbon fibers, boron fibers or metal fibers; such a metal plate or resin sheet, the surface of which is coated by sputtering, evaporation, or plating with a thin film of a different metal and/or an insulating thin film such as of $SiO_2$, $Si_3N_4$, $Al_2O_3$, or AlN; glass; and ceramics.

For use in a solar cell, the substrate of a conductive material such as metal can serve also as the current-collecting electrode. In the case of an insulating substrate such as of resin., it is desirable to form, on a surface thereof to be subjected to the film deposition, a current-collecting electrode of a metal, an alloy, or a transparent conductive oxide, such as Al, Ag, Pt, Au, Ni, Ti, Mo, W, Fe, V, Cr, Cu, stainless steel, brass, nickel-chromium, $SnO_2$, $In_2O_3$, ZnO or ITO by plating, evaporation, or sputtering.

Even in the case of a conductive substrate such as of a metal, a layer of a different metal may be provided on a surface to be subjected to the film deposition, for the purpose of improving the reflectance of the substrate to light of lower wavelengths, or preventing mutual diffusion of the constituent elements between the substrate and the deposited films. Also, in the case of a relatively transparent substrate used for a solar cell for receiving the sunlight through said substrate, it is desirable to deposit, in advance, a conductive thin film such as the aforementioned transparent conductive oxide or a thin metal film.

Also, the surface of said substrate may be smooth or be provided with fine irregularities. In the latter case, said irregularities may have a spherical, conical, or pyramidal form, with a maximum height Rmax thereof preferably within a range from 500 to 5000 Å, whereby said surface provides random light reflection, resulting in an increased optical path length of the light reflected by said surface. The substrate may be formed as a plate, a continuous web, or a cylinder with a smooth or irregular surface according to the particular application. The thickness of said substrate is suitably determined so as to obtain a desired photovoltaic device, but may be made thinner as long as the substrate functions properly, if the photovoltaic device requires flexibility or receives light through the substrate. Said thickness is, however, usually selected equal to or larger than 10 $\mu$m, in consideration of preparation, handling, and mechanical strength of the substrate.

In the photovoltaic device of the present invention, according to the configuration thereof, there are selected suitable electrodes, including the lower electrode, upper (transparent) electrode, and current-collecting electrode. In the following description, the upper electrode indicates an electrode provided at the light entrance side, while the lower electrode indicates an electrode positioned opposite to said upper electrode, across the semiconductor layers. These electrodes will be explained, in more detail in the following.

Lower Electrode

The lower electrode 302 in the present invention is positioned differently in the configurations (A) and (B). In the configuration (A), it is positioned between the substrate 301 and the n-semiconductor layer 303. If the substrate 301 is insulating, the lower electrode 302, serving for current collection, is provided between the substrate 301 and the n-semiconductor layer 303. If the substrate 301 is conductive, it can also serve as the lower electrode. However, even in the case where the substrate 301 is conductive, the electrode 302 may be provided as a low-resistance current-collecting electrode if the sheet resistance of said substrate is high, or for the purpose of increasing the light reflectance at the substrate, thereby utilizing the incident light more efficiently. In the configuration (B) employing a translucent substrate 301 and receiving the light therethrough, the lower electrode 302 is provided opposite to the substrate 301, across the semiconductor layer, for the purpose of current collection and light reflection at said electrode.

Said electrode can be composed of a metal such as Ag, Au, Pt, Ni, Cr, Cu, Al, Ti, Zn, Mo, or W or an alloy thereof, and a thin film of such material is formed, for example, by vacuum evaporation, electron beam evaporation, or sputtering. The thus formed thin film should not constitute a resistive component of the photovoltaic device, and the sheet resistance thereof is preferably equal to or less than 50 $\Omega$ and more preferably equal to or less than 10 $\Omega$.

Between said lower electrode 302 and the n-type semiconductor layer 303, there may be provided a diffusion preventing layer, such as a conductive zinc oxide layer, though it is not illustrated. Such diffusion preventing layer not only functions to prevent the diffusion of metal elements constituting the lower electrode 302 into the n-semiconductor layer, but also to prevent short circuiting resulting from defects such as pinholes between the lower electrode 302 and the transparent electrode 306 positioned across the semiconductor layer, when said diffusion preventing layer is given a certain resistance, and also to trap the incident light within the photovoltaic device by thin film multiple interference.

Upper Electrode (Transparent Electrode)

The transparent electrode 306 employed in the present invention is preferably provided with a light transmittance of at least 85% for achieving efficient absorption of the light from the sun or a white fluorescent lamp in the semiconductor layers, and also with a sheet resistance not exceeding 100 $\Omega$ in order not to constitute a resistive component of the photovoltaic device. Examples of materials with such properties include metal oxides such as $SnO_2$, $In_2O_2$, ZnO, CdO, $CdSnO_2$, and ITO ($In_2O_3 + SnO_2$), and an extremely thin semi-transparent film of a metal such as Au, Al, Cu, etc. In the configuration (A), said transparent electrode is laminated on the p-semiconductor layer 305, while, in the configuration (B), it is provided on the substrate 301, and the materials are selected so as to achieve satisfactory adhesion in the respective configuration. Said electrode may be formed by resistance-heated evaporation, electron beam evaporation, sputtering, or spraying.

Current-Collecting Electrode

The current-collecting electrode 307 in the present invention is provided on the transparent electrode 306 in the configuration A, in order to reduce the surface resistance thereof, and is composed, for example, of a thin film of a metal such as Ag, Cr, Ni, Al, Ag, Au, Ti, Pt, Cu, Mo, W, or an alloy thereof. Said thin film may comprise a plurality of layers in laminated form, and the shape and area of such thin film are suitably designed so as to ensure sufficient incident light to the semiconductor layers. For example, it is desired that said electrode be uniformly distributed over the light-receiving surface of the photovoltaic device, and the area of said electrode is preferably equal to or less than 15%, more preferably 10% of the light-receiving surface of the photovoltaic device. Also, the sheet resistance of said electrode is preferably equal to or less than 50 Ω, more preferably equal to or less than 10 Ω.

The semiconductor layers 303, 304, and 305 are prepared by known thin film forming processes such as evaporation, sputtering, RF plasma CVD, microwave plasma CVD, ECR, thermal CVD, or LPCVD, which can be suitably selected. Industrially, there is preferably employed plasma CVD in which deposition onto the substrate is caused by decomposition of raw material gas in a plasma. The reaction apparatus may be batch type or continuous type. A doped semiconductor may be formed by simultaneously decomposing $PH_3$ or $B_2H_6$ gas containing phosphorus or boron as a constituent.

i-Semiconductor Layer

In the i-semiconductor layer adapted for use in the present photovoltaic device, examples of the material for forming the i-semiconductor layer of amorphous silicon-germanium include so-called Group IV alloy semiconductors such as a-SiGe:H, a-SiGe:F, and a-SiGe:H:F. Also, in a tandem cell structure with stacked unit devices, examples of materials for forming the i-semiconductor layer besides amorphous silicon-germanium include the so-called Group IV alloy semiconductors such as a-Si:H, a-Si:F, a-Si:H:F, a-SiC:H, a-SiC:F, a-SiC:H:F, poly-Si. H, poly-Si:F, and poly-Si:H:F, and the so-called Gruop III-V and II-VI compound semiconductors.

The raw material gas for CVD is a linear or cyclic silane, and specific examples thereof include gaseous or easily gasifiable compounds such as $SiH_4$, $SiF_4$, $(SiF_2)_5$, $(SiF_2)_6$, $(SiF_2)_4$, $Si_2F_6$, $Si_3F_8$, $SiHF_3$, $SiH_2F_2$, $Si_2H_2F_4$, $Si_2H_3F_3$, $SiCl_4$, $(SiCl_2)_5$, $SiBr_4$, $(SiBr_2)_2)_5$, $SiCl_6$, $SiHCl_3$, $SiHBr_2$, $SiH_2Cl_2$, and $SiCl_3F_3$.

Examples of the germanium-containing compound include linear germanes, linear halogenated germanes, cyclic germanes, cyclic halogenated germanes, linear or cyclic germanium compounds or organogermanium compounds containing alkyl radicals, such as $GeH_4$, $Ge_2H_6$, $Ge_3H_8$, n-$Ge_3H_{10}$, t-$Ge_4H_6$, $Ge_3H_6$, $Ge_5H_{10}$, $GeH_3Cl$, $GeH_2Cl_2$, $Ge(CH_3)_4$, $Ge(C_2H_5)_4$, $Ge(C_6H_5)_4$, $Ge(CH_3)_2F_2$, $GeF_2$, and $GeF_4$.

p- and n-Semiconductor Layers

The material constituting the p- or n-semiconductor layer adapted for use in the present photovoltaic device is the aforementioned material for constituting the i-semiconductor layer, doped with a valence electron controlling material. Such p- or n-semiconductor layer can be advantageously formed by the same methods as those employed for preparing the i-semiconductor layer. In the case of depositing a film of a Group IV element of the periodic table, there is employed a compound containing an element of the group III of the periodic table as the valence electron controlling material for obtaining a p-type semiconductor, and examples of the element of the Group compounds containing the Group III element include $BF_3$, $B_2H_6$, $B_4H_{10}$, $B_5H_9$, $B_5H_{11}$, $B_6H_{10}$, $B(CH_3)_3$, $B(C_2H_5)_3$, $B_6H_{12}$, $Al(CH_3)_2Cl$, $Al(CH_3)_3$, $Al(OCH_3)_2Cl$, $Al(CH_3)Cl_2$, $Al(C_2H_5)_3$, $Al(OC_2H_2)_3$, $Al(CH_3)_3Cl_3$, $Al(i-C_4H_9)_5$, $Al(C_3H_7)_3$, $Al(OC_4H_9)_3$, $Ga(OCH_3$, $Ga(OC_2H_5)_3$, $Ga(OC_3H_7)_3$, $Ga(CH_3)_3$, $Ga_2H_6$, $GaH(C_2H_5)_2$, $Ga(OC_2H_5)-(C_2H_5)_2$, $In(CH_3)_3$, $In(C_3H_7)_3$, and $In(C_4H_9)_3$.

A compound containing a Group V element is used as the valence electron controlling material, for obtaining an n-type semiconductor. Examples of the Group V element include P, N, As, and Sb, and examples of compounds containing the Group V element include $NH_3N_3$, $N_2H_5N_3$, $N_2H_4$, $NH_4N_3$, $P(OCH_3)_3$, $P(OC_2H_5)_3$, $P(C_3H_7)_3$, $P(OC_4H_9)_3$, $P(CH_3)_3$, $P(C_2H_5)_3$, $P(C_3H_{73}$, $P(C_4H_9)_3$, $P(OC_3H_7)_3$, $P(OC_4H_9)_3$, $P(SCN)_3$, $P_2H_4$, $PH_3$, $AsH_3$, $As(OCH_3)_3$, $As(OC_2H_5)_3$, $As(OC_3H_7)_3$, $As(OC_4H_9)_3$, $As(CH_3)_3$, $As(C_2H_5)_3$, $As(C_6H_5)_3$, $Sb(OCH_3)_3$, $Sb(OC_2H_5)_3$, $Sb(OC_3H_7)_3$, $Sb(OC_4H_9)_3$, $Sb(CH_3)_3$, $Sb(C_3H_7)_3$, and $Sb(C_4H_9)_3$.

Such raw materials gases may be used singly, or in a combination of two or more kinds.

If said raw material is gaseous under normal temperature and pressure, the amount introduced in a film forming chamber is controlled, for example, by a mass flow controller (MFC). If it is liquid, it is gasified by bubbler capable of temperature control and employing rare gas such as Ar or He or hydrogen as the carrier gas, while, if it is solid, it is gasified by a heated sublimation oven employing a rare gas such as Ar or He or hydrogen as the carrier gas, and the introduced amount is controlled principally by the carrier gas flow rate and the temperature.

Figure 2B:
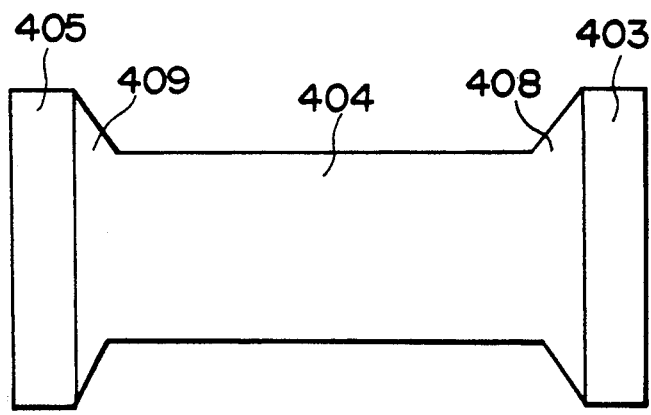
Figure 2C:
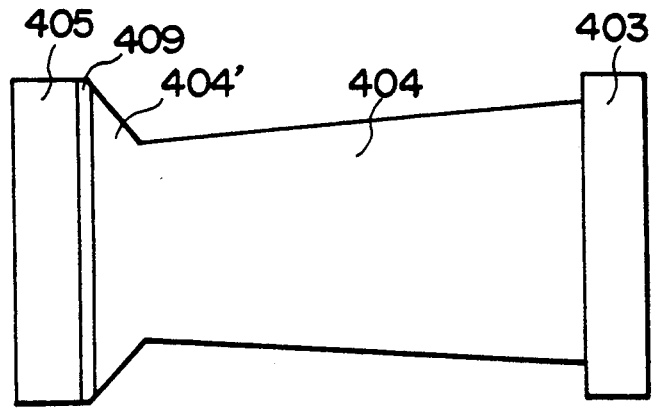

The profile of the band gap of a conventional device with the configuration in FIG. 1A is represented by FIGS. 2A to 2C, wherein the upper line represents the bottom of the conduction band, while the lower line represents the top of the valence electron band; 403 indicates the n-semiconductor layer, 405 p-semiconductor layer, 404 and 404' indicate i-semiconductor layers, and 408 and 409 are buffer layers.

In FIG. 2A, the band gap of the i-semiconductor layer 404 is narrower than that of the doped layer 403, 405. In such a band gap profile, the open-circuit voltage, being determined by the i-semiconductor layer 404, becomes smaller if a material of a narrower band gap is employed. Also, the free electrons and free positive holes generated in the i-semiconductor layer 404 adjacent to the p-semiconductor layer 405 are lost and not outputted effectively due to the recombination by recombination levels present at a high concentration at the p-i interface. Also, the light intensity is higher at the light entrance side and decreases exponentially by the internal absorption. The light energy absorbed at the entrance side is larger than the band gap, so that the energy cannot be effectively utilized.

In order to avoid such drawbacks, there is employed a configuration involving buffer layers as shown in FIG. 2B, wherein the buffer layers 408, 409 have the effect of reducing the local energy levels at the p-i and n-i interfaces. There is also proposed a device configuration as shown in FIG. 2C, wherein 403 and 405 indicate the doped semiconductor layers and 404 indicates an i-semiconductor layer, and the light enters from the left side.

At the light entrance side of the i-semiconductor layer 404, there is provided a buffer layer 409 not containing the band gap regulating material in order to widen the band gap, and a graded buffer layer 404' is then provided in which the band gap regulating material is gradually increased to correspondingly reduce the band gap. In said layer 404, the band gap regulating material is gradually decreased to widen the band gap.

Such band gap profile allows effective utilization of the light, increases the open-end voltage, and improves the fill factor. Such configuration is considered principally for improving the initial efficiency, but no particular consideration is given to its photodeterioration.

The present invention is characterized by a device configuration with reduced photodeterioration, in addition to the improvement in the initial efficiency attained by the above-mentioned improvement in the band gap profile. The present inventors have found that amorphous silicon-germanium shows reduced photodeterioration at a certain composition of germanium, and have invented a cell with a high conversion efficiency, utilizing amorphous silicon-germanium of such composition with reduced photodeterioration. In the following there are shown the experiments of the present inventors that have led to the present invention.

EXPERIMENT 1

Figure 3:
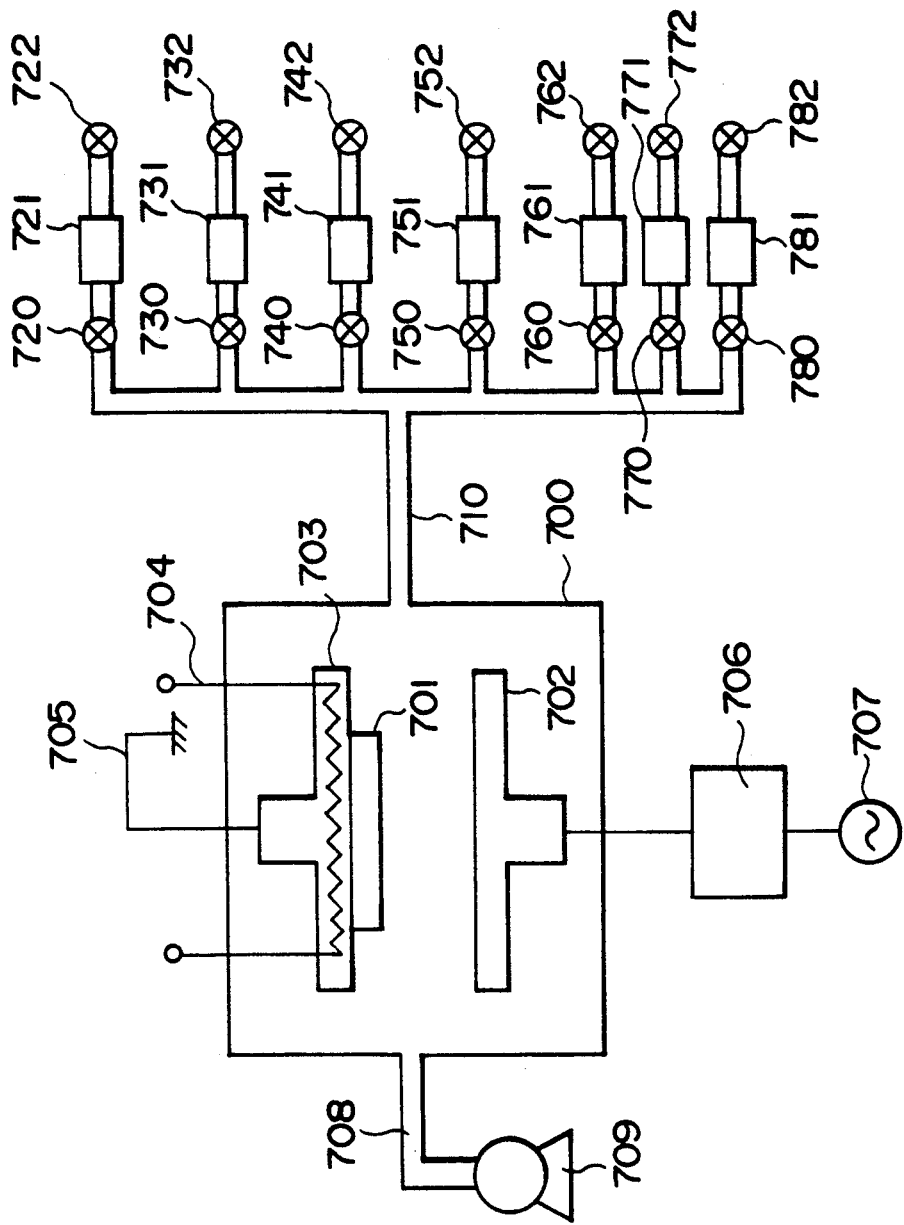
FIG. 3 is a schematic view of a film forming apparatus adapted for preparing the photovoltaic device of the present invention.

An amorphous silicon-germanium film was prepared using a known RF discharge plasma CVD apparatus shown in FIG. 3. In FIG. 3 there are shown a reaction chamber 700; a substrate 701; an anode 702; a cathode 703; a substrate heater 704; a grounding terminal 705; a matching box 706; an RF power source 707 of 13.56 MHz; an exhaust pipe 708; a vacuum pump 709; a film forming gas introduction pipe 710; valves 720, 730, 740, 750, 760, 770, 780, 722, 732, 742, 752, 762, 772, and 782; and mass flow controllers 721, 731, 741, 751, 761, 771, and 781.

A glass substrate 701 of 5 cm square size, #7059 supplied by Corning Corp., was mounted on the cathode in the reaction chamber 700, which was sufficiently evacuated by the vacuum pump 709 until an ion gauge (not shown) indicated a pressure of $10^{-6}$ Torr. Then the substrate 701 was heated to 300° by the substrate heater 704. After the substrate temperature became constant, the valves 720, 722 were opened and the mass flow controller 721 was so controlled as to introduce 30 sccm of SiH$_4$ gas into the reaction chamber 700 from a tank (not shown). Similarly, valves 740, 742 were opened and the mass flow controller 741 was controlled to introduce 300 sccm of H$_2$ gas, and the valves 730, 732 were opened and the mass flow controller 731 was controlled to introduce 1 sccm of GeH gas. A pressure controller (not shown) was regulated so as to maintain the pressure in the reaction chamber 700 at 1.5 Torr, then a power of 20 W was provided by the RF source 707, and plasma discharge was conducted for 20 minutes while reflected waves were minimized by adjustment of the matching box 706, thereby depositing amorphous silicon-germanium film with a thickness of 1 μm. After the gas supply was terminated, the sample was taken out from the reaction chamber 700 and numbered as S-1. Similarly, samples S-2, S-3, S-4, S-5, and S-6 were prepared by varying the amount of GeH. gas respectively to 3, 5, 10, 20, and 40 sccm.

A part of each of these samples was subjected to elemental analysis by Auger electron spectroscopy, for determining the composition ratio of germanium in the film. Components other than germanium were silicon and hydrogen. Also, the optical band gap was determined by the measurement of absorption coefficient on a part of each sample with a visible spectrometer. The obtained results are summarized in Table 1.

TABLE 1

| Sample | GeH$_4$ flow rate (sccm) | Germanium amount (atom. %) | Optical band gap (eV) |
|---|---|---|---|
| S-1 | 1 | 11 | 1.67 |
| S-2 | 3 | 23 | 1.56 |
| S-330 | 5 | 28 | 1.53 |
| S-4 | 10 | 52 | 1.42 |
| S-5 | 20 | 65 | 1.30 |

A part of each sample was then placed in an electron beam evaporation apparatus (not shown) (ULVAC model EBX-6D), and a Cr electrode of a thickness of 1000 Å and a length of 1 cm was deposited with a gap width of 250 μm, under vacuum. Then these samples were maintained at 25° on a temperature-controlled support member, and were subjected to the measurement of initial photoconductivity $\sigma_p(0)$ under irradiation of the sunlight spectrum of AM-1.5 with an intensity of 100 mW/cm$^2$, employing an artificial sunlight source (hereinafter called solar simulator), employing a xenon lamp as the light source. Also, the photoconductivity $\sigma_p(100)$ was measured after continuous irradiation for 100 hours with the light of said simulator.

The obtained results are shown in FIG. 4. As will be understood from FIG. 4, the films with higher composition ratios of germanium show less photodeterioration, and the film becomes stable to light irradiation if the composition ratio of germanium is equal to or larger than 20 at. %, and is extremely stable when said ratio is equal to 30 at. % or higher.

EXPERIMENT 2

A solar cell of the configuration (A) shown in FIG. 1 was prepared, employing the known RF discharge plasma CVD film forming apparatus shown in FIG. 3, in the following manner.

At first, a SUS 304 stainless steel substrate 701 of 5 cm square, the surface of which was mirror polished to Rmax of 0.05 μm, was placed in a sputtering apparatus (not shown). After the interior was evacuated to a pressure of $10^{-7}$ Torr or lower, Ar gas was introduced, and a Ag film of a thickness of ca. 5000 Å was deposited by sputtering from a Ag target, by inducing a DC plasma discharge with a power of 200 W under an internal pressure of 5 mTorr.

Then, a ZnO film of a thickness of ca. 5000 Å was deposited by sputtering from a ZnO target with DC plasma discharge, under the same internal pressure and power as described above.

After the preparation of the lower electrode 302 by the above-explained steps, the substrate 701 was mounted on the cathode in the reaction chamber 700, which was then sufficiently evacuated by the vacuum pump 709, until the pressure in the chamber 700, measured with an ion gauge (not shown), reached $10^{-6}$ Torr. Then the substrate 701 was heated to 300° C. by the substrate heater 704. After the substrate temperature became constant, the valves 720, 722 were opened and the mass flow controller 721 was regulated so as to introduce 30 sccm of SiH$_4$ gas into the reaction chamber 700 from a gas tank (not shown), through the gas pipe 710. Similarly, the valves 740, 742 were opened and the mass flow controller 741 was adjusted to introduce 300 sccm of H$_2$ gas, and the valves 750, 752 were opened and the mass flow controller 751 was adjusted to introduce 10 sccm of PH$_3$ gas, diluted to 5% with Hz gas. After the internal pressure of the reaction chamber 700 was regulated to 1.5 Torr, a power of 10 W was supplied from the RF source 707 through the matching box 706, thereby inducing plasma discharge for 3 minutes and depositing an amorphous n-silicon layer 303 of a thickness of 400 Å.

After the gas supply was terminated, the reaction chamber 700 was again evacuated to a pressure of $10^{-6}$ Torr, and the valves 720, 722, 730, 732, 740, 742 were opened to introduce 30 sccm of $SiH_4$ gas, 10 sccm of $GeH_4$ gas, and 300 sccm of $H_2$ gas. Then plasma discharge was conducted for 20 minutes by supplying a power of 20 W from the RF source 707, thereby depositing an amorphous i-silicon-germanium layer 304 with a thickness of ca. 2000 Å. The band gap of the amorphous silicon-germanium film deposited under these conditions is about 1.42 eV, as confirmed in experiment 1.

Then, after the RF power for plasma discharge and the gas supply were terminated, the reaction chamber 700 was again evacuated to a pressure of $10^{-6}$ Torr, and the valves 720, 722, 740, 742, 760, 762 were opened to introduce 1 sccm of SiH gas, 300 sccm of $H_2$ gas, and 10 sccm of $B_2H_6$ gas diluted to a 5% with $H_2$ gas into the reaction chamber 700. Plasma discharge was conducted for 5 minutes by supplying a power of 200 W from the RF source 707 to deposit a p-layer with a thickness of 100 Å. It was confirmed that the p-layer deposited under these conditions was microcrystalline with grain size of 20 to 100 Å, by reflective high-energy electron diffraction on a sample deposited on a glass substrate.

Then, the substrate 701 was placed in a resistance-heated evaporation apparatus (not shown). After the interior of said apparatus was evacuated to a pressure of $10^{-7}$ Torr, oxygen was introduced with an internal pressure of 0.5 mTorr and an In-Sn alloy was evaporated by resistance heating, thereby depositing a transparent conductive film (ITO film) with a thickness of 700 Å constituting the upper electrode 306 and serving also for antireflection. Subsequently, the sample was separated into sub cells of $1 \times 1$ cm each in a dry etching apparatus (not shown), and current-collecting aluminum electrodes 307 were formed by electron beam evaporation in another apparatus.

Figure 5A:
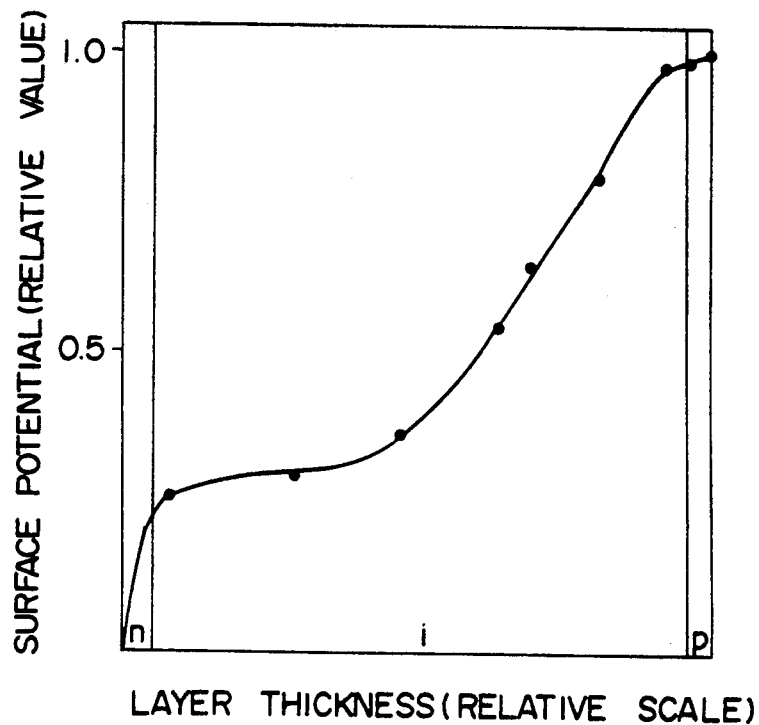
FIGS. 5A and 5B are graphs showing potential distribution in the i-semiconductor layer in the photovoltaic device.

A part of this sample was placed in a vacuum container, and subjected to measurement of the surface photovoltaic force by positioning the probe of a surface potential meter on the surface of said sample. Then the potential distribution in the thickness direction was measured by effecting etching with the introduction of sputter-etching gas with a known etching rate. As will be apparent from the results shown in FIG. 5A, the potential distribution within the i-semiconductor layer varies more in the vicinity of the p-semiconductor layer than in the vicinity of the n-semiconductor layer. Consequently, the depletion layer is reduced close to the p-i interface, and the area close to the n-semiconductor layer constitutes a pseudo neutral area where the internal electric field is extremely weak. Therefore the light utilization efficiency is considered to be lowered, as the carriers generated in the vicinity of the n-semiconductor layer are unable to experience a strong enough electric field to reach the p-semiconductor layer.

Figure 5B:
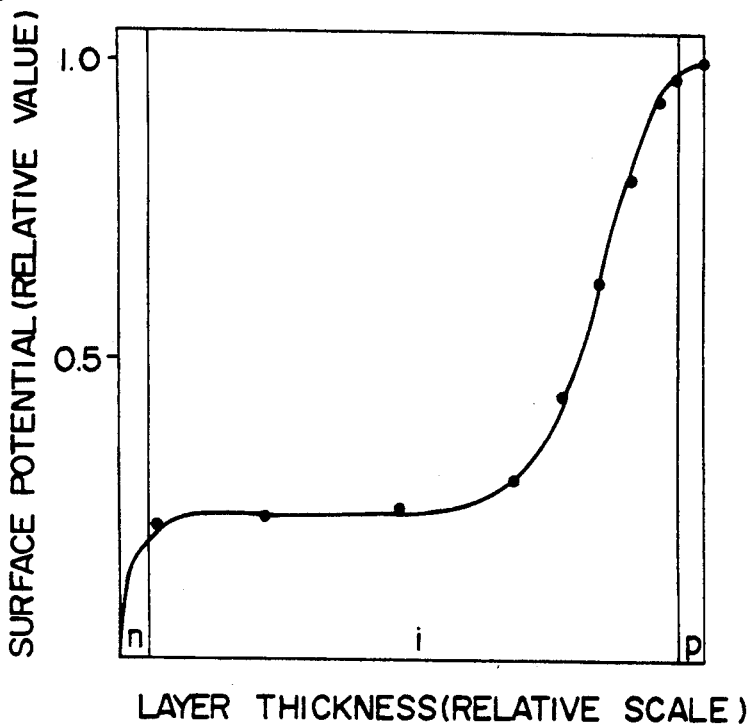

Then the remaining part of said sample was subjected, at 25° C. on a temperature-controlled support member, to continuous light irradiation for 100 hours with the light of the solar spectrum of AM-1.5 and an intensity of 100 mW/cm² by a solar simulator employing a xenon lamp as the light source, and the potential distribution in the thickness direction of the sample was measured by sputter-etching in the same manner as explained above. As will be apparent from the results shown in FIG. 5B, in the potential distribution within the i-semiconductor area, the pseudo neutral area, with weak electric field, in the vicinity of the n-semiconductor area had expanded, so that the efficiency of collecting the photocarriers generated in the i-semiconductor layer is further lowered in comparison with the state prior to the light irradiation. Such change in potential distribution, found in the light irradiation of an amorphous silicon-germanium film, is known to affect the photovoltaic force of the device, but the cause of this phenomenon has not yet been clarified.

In the conventional device configuration, improvements in the performance of a solar cell have been attempted by the incorporation of a buffer layer or layers between the p- and/or n-semiconductor layer and the intrinsic layer and for the initial performance of the solar cell by forming a so-called graded or inclined layer by varying the composition of silicon and germanium within the intrinsic layer. In such a solar cell, however, consideration has not been given to the electric field distribution in the depth direction of the i-layer for avoiding the photodeterioration, although the initial efficiency has been improved by the use of buffer layers and the inclined layer.

The device configuration of the present invention is characterized by the absence of amorphous silicon-germanium of a composition susceptible to photodeterioration, and by improved initial efficiency through the use of buffer layers.

Figure 6:
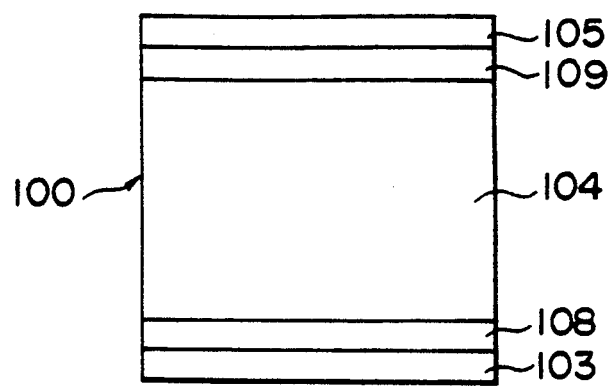
FIG. 6 is a schematic cross-sectional view of a semiconductor body with pin structure used in the photovoltaic device of the present invention.
Figure 7:
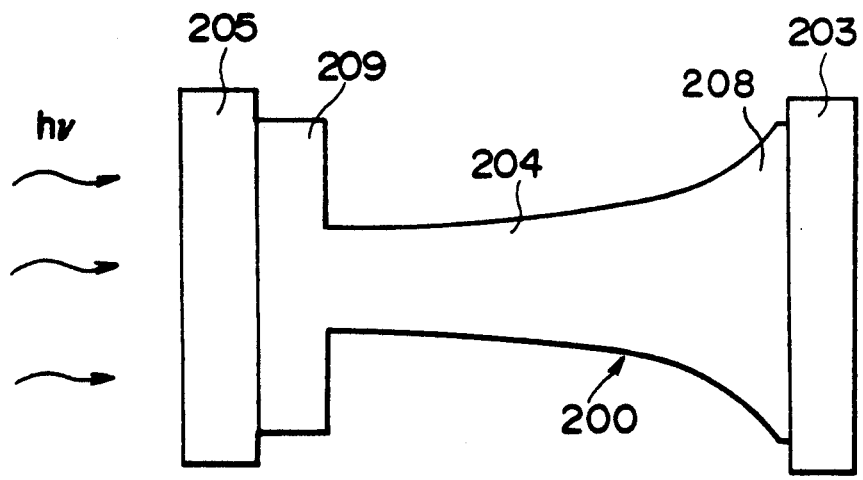
FIG. 7 is a view showing the energy band profile in the pin structure shown in FIG. 6.

FIG. 6 is a schematic view of one of the configurations of the photovoltaic device of the present invention, obtained by improving the conventional configuration based on the aforementioned experimental results. FIG. 6 illustrates only the semiconductor layer 100 of said device, including an n-layer 103, buffer layers 108, 109, an i-layer 104, and a p-layer 105. FIG. 7 shows the band gap profile of said device, in which the light hν enters from the left side. In FIG. 7 there are shown the i-layer 200, n-layer 203, amorphous silicon-germanium layer 204, p-layer 205 and buffer layers 208, 209. The buffer layers 208, 209 are composed of amorphous silicon free from germanium, with a band gap of ca. 1.7 eV and capable of absorbing light of wavelengths from 300 to 730 nm. The i-layer 204 is prepared by decomposing the silicon-containing gas and the germanium-containing gas during film formation, and the inclined energy levels are obtained by varying the composition ratio of germanium, through a variation in the flow rate ratio of said gases. The band gap of the i-layer 204, about 1.7 eV at the portion in contact with the buffer layer 208, becomes narrower toward the light entrance side, steeply in the beginning and more slowly afterwards, to about 1.45 eV at the portion in contact with the buffer layer 209. The effect of such band profile will be explained in the following.

The irradiating light enters from the side of the p-semiconductor layer 205, generating photocarriers in the buffer layer 209, i-layer 204, and buffer layer 208. The buffer layer 209 absorbs only the light of shorter wavelengths and transmits the light of longer wavelengths because of its wide band gap, so that the light can reach the deepest parts of the device and be effectively utilized. Also, if the p-i interface is prepared with an amorphous silicon-germanium film, the performance of the solar cell is deteriorated due to a high concentration or recombination energy levels, generated by the inferior quality of said film and by the lattice mismatch between the p-layer and the amorphous silicon-germanium. On the other hand, if said p-i interface is prepared with the amorphous silicon, a relatively low concentration of recombination levels allows effective utilization of the photocarriers of a high concentration, generated at said interface, and also increases the open-circuit voltage.

The buffer layer 208 has similar functions to those of the buffer layer 209, for example relaxing the lattice mismatch at the n-i interface.

Said band gap profile also functions in the following manner with respect to the collection of photocarriers. In the i-layer 204 under light irradiation, since the inclination of energy level at the bottom of the conduction band is smaller than that at the top of the valence electron band, the electric field becomes weaker to the free electrons generated at the p-layer side. Consequently, although the free electrons are affected unfavorably at the n-layer 203, the free electrons can be effectively outputted because the electrons generally have higher drift-mobility than the positive holes. On the other hand, since the inclination of energy level at the top of the valence electron band is larger than that at the bottom of the conduction band, the electric field functions stronger with respect to the free positive holes. Thus, the free positive holes generated in a position close to the p-layer 205 are easy to collect because of the short drift distance, and those generated close to the n-layer 203 can also be effectively collected as they are accelerated by a strong electric field. The performance of the solar cell can be improved by such configuration with an increased electric field acting on the positive holes, since said performance is generally governed by the drift-mobility of the positive holes.

In the solar cell of the present invention, having the band profile shown in FIG. 7, the photodeterioration is suppressed in the amorphous silicon-germanium film, since the maximum composition ratio of germanium therein is at least equal to 20 at. %. Also in said solar cell, the variation in composition ratio of germanium in the depth direction of the amorphous silicon-germanium film is larger in an area closer to the n-layer 203 and smaller in an area closer to the p-layer 205. The effect of such structure against photodeterioration can be explained in the following manner. In the i-layer 204 under light irradiation, the electric field becomes stronger to the free positive holes, because the inclination of energy level at the top of the valence electron band is larger than that at the bottom of the conduction band. On the other hand, under continuous light irradiation, it is confirmed experimentally that the electric field distribution in the i-layer 204 remains strong in an area close to the p-layer 205, while the area of weaker distribution spreads from the side of the n-layer 203 to the central area. Such weaker electric field distribution unfavorably affects the free positive holes generated in a position close to the n-layer 203, thus deteriorating the carrier collecting efficiency, but such free positive holes are accelerated by the increased inclination of energy level at the top of the valence electron band, resulting from the aforementioned composition ratio of germanium, so that the performance of solar cell is not much affected.

EXAMPLE 1

Solar cells of the configuration (A) shown in FIG. 1, incorporating the pin layers of the band profile of the present invention, were prepared in the following manner, employing the apparatus shown in FIG. 3.

At first, as in the foregoing experiments, a SUS 304 stainless steel substrate 301 of 5 cm square shape, the surface of which was mirror polished to Rmax of 0.05 $\mu$m, was placed in a sputtering apparatus (not shown). After the interior was evacuated to a pressure of $10^{-7}$ Torr, Ar gas was introduced to an internal pressure of 5 mTorr, and a Ag film of a thickness of ca. 5000 Å was deposited by sputtering from a Ag target, by inducing DC plasma discharge with a power of 200 W.

Then a ZnO film of a thickness of ca. 5000 Å was deposited by sputtering from a ZnO target with DC plasma discharge, under the same internal pressure and power conditions as explained above.

After the preparation of the lower electrode 302 by the above-explained steps, the substrate 301 was mounted on the cathode in the reaction chamber 700, which was then sufficiently evacuated by the vacuum pump 709, until the pressure in the chamber 700, measured with an ion gauge (not shown), reached $10^{-6}$ Torr. Then the substrate 301 was heated to 300° C. by the substrate heater 704. After the substrate temperature became constant, the valves 720, 722 were opened and the mass flow controller 721 was regulated so as to introduce 30 sccm of $SiH_4$ gas into the reaction chamber 700 from a gas tank (not shown), through the gas pipe 710. Similarly, the valves 740, 742 were opened and the mass flow controller 741 was adjusted to introduce 300 sccm of $H_2$ gas, and the valves 750, 752 were opened and the mass flow controller 751 was adjusted to introduce 10 sccm of $PH_3$ gas, diluted to 5% with $H_2$ gas. After the internal pressure of the reaction chamber 700 was regulated to 1.5 Torr, a power of 10 W was supplied from the RF source 707 through the matching box 706, thereby inducing plasma discharge for 3 minutes and depositing an amorphous n-silicon layer 303 of a thickness of 400 Å.

After the gas supply was terminated, the reaction chamber 700 was again evacuated to a pressure of $10^{-6}$ Torr, and the valves 720, 722, 730, 732, 740, and 742 were opened to introduce 30 sccm of $SiH_4$ gas, GeH gas, and 300 sccm of $H_2$ gas into the reaction chamber 700. The flow rate of the mass flow controller 731 for $GeH_4$ gas was maintained at 0 sccm at the start of film formation. Plasma discharge was induced by supplying a power of 20 W from the RF source 707 to effect film formation for 20 minutes, during which time the flow rate of $GeH_4$ gas was gradually varied as indicated by curve C-1 in FIG. 8 to 20 sccm, thereby depositing an amorphous i-silicon-germanium layer 304 of a thickness of ca. 2000 Å. The mass flow controller 731 had a sufficiently high response speed, so that the set flow rate was reached within 1 second without overshooting, and with an error not exceeding ±2%. A pressure controller (not shown) was regulated so that the pressure fluctuation was not caused by a sudden change in the flow rate. The flow rate control with the mass flow controller 731 was precisely conducted with a microcomputer. The amorphous silicon-germanium film, deposited under the above-mentioned conditions had a narrowest band gap of ca. 1.3 eV, as confirmed in the foregoing experiments.

Then the mass flow controller 731 for GeH$_4$ gas was shifted to 0 sccm and the solenoid valves were closed to instantaneously shift said flow rate to 0 sccm, and the film formation was continued with SiH$_4$ and H$_2$ only, for 10 seconds, to deposit a buffer layer 109 of a thickness of 300 Å.

Then, after the RF power for plasma discharge and the gas supply were terminated, the reaction chamber 700 was again evacuated to a pressure of 10$^{-6}$ Torr, and the valves 720, 722, 740, 742, 760, and 762 were opened to introduce 1 sccm of SiH$_4$ gas, 300 sccm of Hz gas and 10 sccm of B$_2$H$_6$ gas diluted to 5% with H$_2$gas into the reaction chamber 700. Plasma discharge was conducted for 5 minutes by supplying a power of 200 W from the RF source 707 to deposit a p-layer with a thickness of 100 Å. It was confirmed that the p-layer deposited under these conditions was microcrystalline with grain size of 20 to 100 Å, by reflective high-energy electron diffraction (RHEED) on a sample deposited on a glass substrate.

Then the substrate 101 was placed in a resistance-heated evaporation apparatus. After the interior of said apparatus was evacuated to a pressure of 10$^{-7}$ Torr, oxygen was introduced with an internal pressure of 0.5 mTorr and an In-Sn alloy was evaporated by resistance heating, thereby depositing a transparent conductive film (ITO film) with a thickness of 700 Å constituting the upper electrode 306 and serving also for antireflection. Subsequently, the sample was separated into sub cells of 1×1 cm each in a dry etching apparatus, and current-collecting aluminum electrodes 307 were formed by electron beam evaporation in another apparatus. The obtained solar cell was numbered as C-1.

Figure 8:
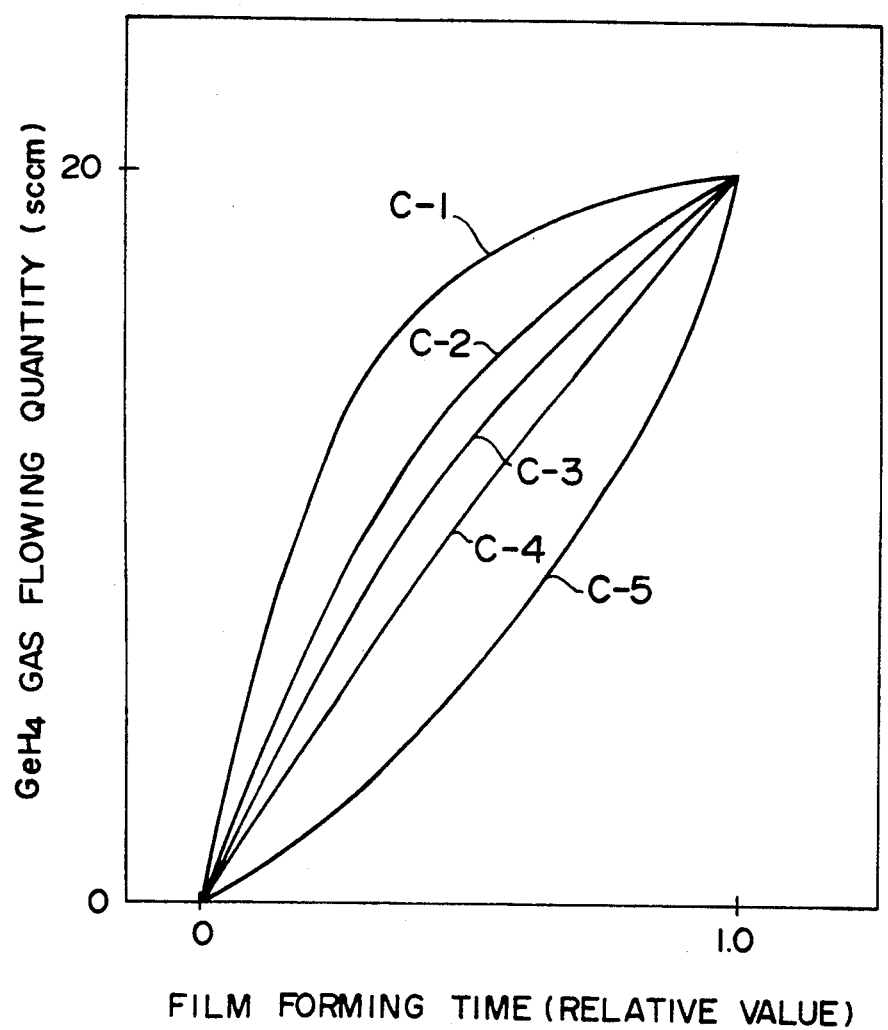
FIG. 8 is a graph showing the gas flow rate profile during formation of the i-layer in the photovoltaic device of the present invention.
Figure 9:
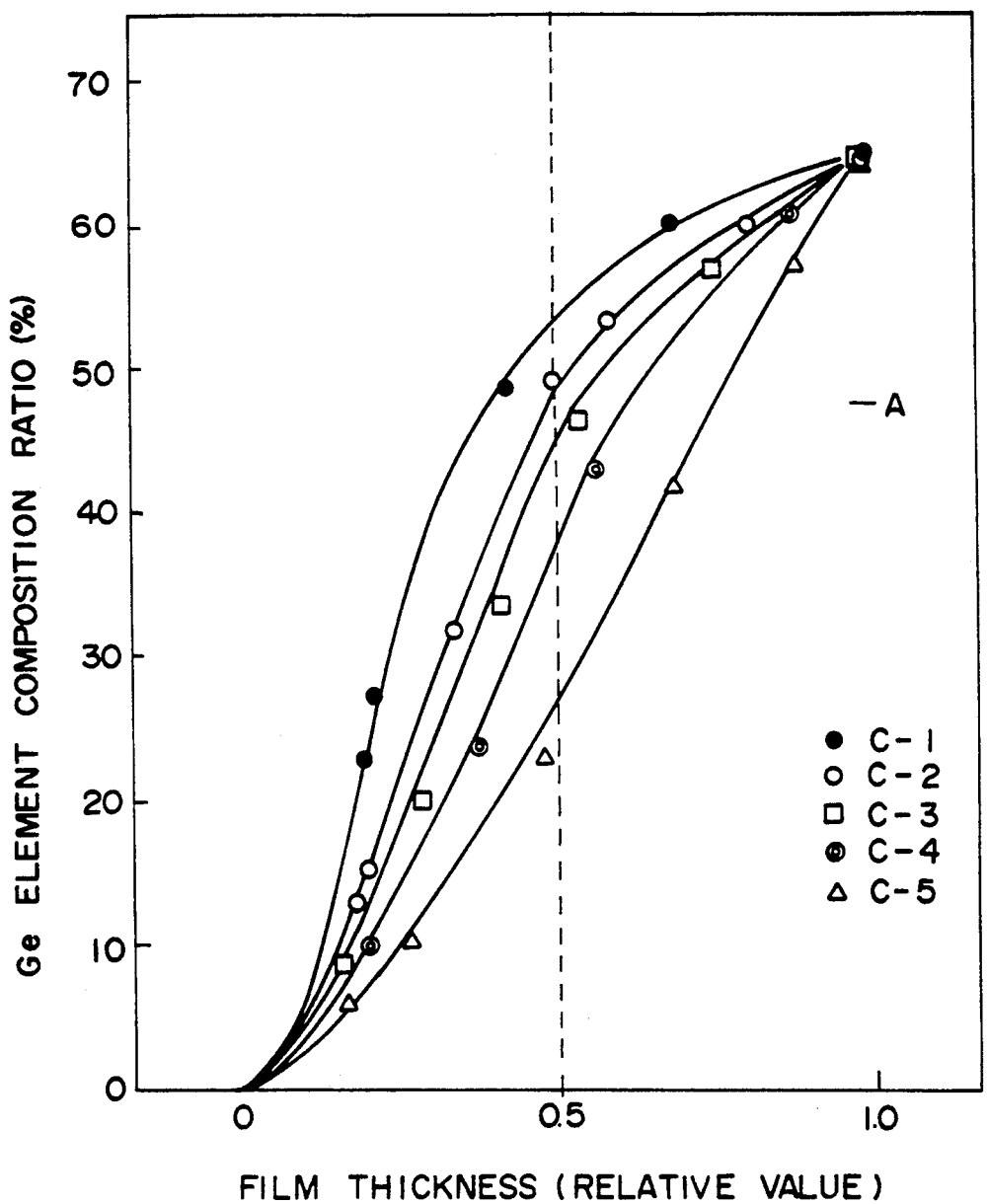
FIG. 9 is a graph showing the relation between the composition ratio of germanium in the i-layer of the photovoltaic device of the present invention and film thickness.

Also, samples C-2, C-3, C-4 and C-5 with different variation rates of the composition ratio of germanium in the i-layer were prepared in an identical manner, except that the flow rate control by the mass flow controller 731 for GeH$_4$ gas was varied, as shown in FIG. 8, for determining the optimum variation rate.

The composition ratio of germanium in the i-layer was determined by elemental analysis of a part of each sample, by Auger electron spectroscopy. Components other than germanium were silicon and hydrogen. The obtained results are summarized in FIG. 9, in which a point A corresponds to 75% of the maximum composition ratio of germanium. The samples C-1 and C-2 contain at least 75% of the maximum composition ratio of germanium, already at the center of the film thickness.

The initial characteristics of these solar cells were measured from their voltage-current curves, obtained under irradiation with light of AM-1.5 and an intensity of 100 mW/cm$^2$ in the solar simulator. The obtained results are shown in Table 2.

TABLE 2

| Sample | Conversion efficiency $\eta$ |
|--------|------------------------------|
| C-1    | 1.00                         |
| C-2    | 0.99                         |
| C-3    | 0.95                         |
| C-4    | 0.96                         |
| C-5    | 0.97                         |

The conversion efficiency $\eta$ is normalized, taking that of the sample C-1 as unity.

These results indicate that the initial efficiency is scarcely affected by the variation rate of the composition ratio of germanium in the i-layer.

After the measurements of the initial characteristics as explained above, the photodeterioration of these samples was measured in the following manner.

At first, the initial photoelectric conversion efficiency $\eta(0)$ was measured for each sample under irradiation with light of AM-1.5 (100 mW/cm$^2$) from the side of the upper electrode 306. Then an optimum load was calculated from the open-circuit voltage Voc and the short circuit current Isc obtained during the determination of said conversion efficiency, and a load resistor was connected to each sample.

Each sample with connected load resistor was subjected, on a support table maintained at 25° C., to continuous irradiation for 500 hours with the light of AM-1.5 (100 mW/cm$^2$), and thereafter the photoelectric conversion efficiency $\eta(500)$ was determined under irradiation with light of AM-1.5 (100 mW/cm$^2$) from the side of the upper electrode 306 in the same manner as explained above. Based on thus obtained $\eta(500)$ and $\eta(0)$ values, the deterioration rate $\{1- \downarrow (500)/\eta(0)\}$ was determined.

Figure 10:
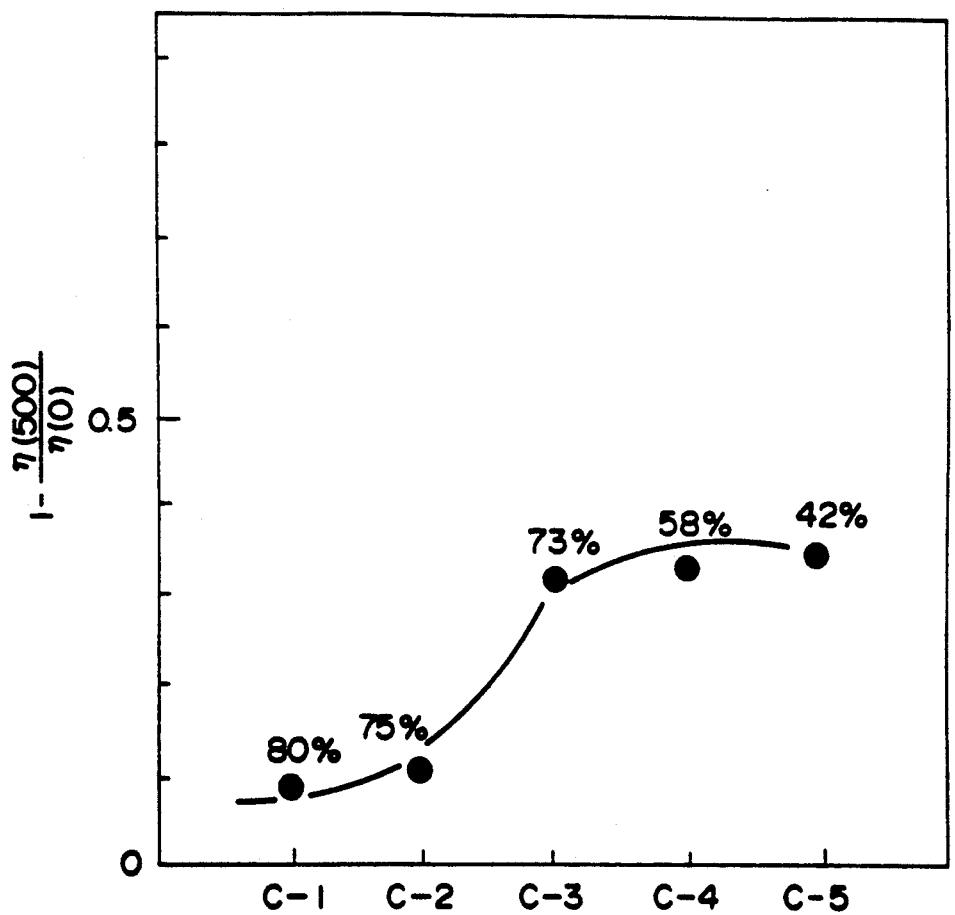
FIGS. 10 and 11 are graphs showing changes in characteristics due to photodeterioration in the photovoltaic device of the present invention.

As will be apparent from the results shown in FIG. 10, the device is stable to light irradiation if the rate of increase of germanium in the composition ratio is steep at the n-layer side namely if the rate of increase of germanium is such that the i-layer contains at least 75% of the maximum composition ratio of germanium at the center of the thickness of the i-layer.

EXAMPLE 2

Solar cells of the configuration shown in FIG. 1A, incorporating an i-layer of the band gap profile shown in FIG. 7, were prepared in the same manner as in the example 1, employing the apparatus shown in FIG. 3.

A stainless steel substrate 301, on which a lower electrode 302 was deposited, was subjected, in the reaction chamber 700, to the deposition of an n-layer 103 with a thickness of 400 Å and a buffer layer 108 with a thickness of 300 Å, and further subjected to the deposition of an amorphous i-silicon-germanium layer 104 of a thickness of ca. 2000 Å, having a minimum band gap of 1.30 eV, with five patterns of flow rate control by the mass flow controller for GeH$_4$ gas, as in the example 1. The GeH flow rate profiles in the samples C-1 to C-5 respectively correspond to those in C-6 to C-10.

Then a buffer layer 109 with a thickness of 300 Å was deposited.

Next, a microcrystalline p-silicon layer 105 was deposited with a thickness of 100 Å.

The substrate 301 was taken out from the reaction chamber 700, and an upper electrode 306 and a current-collecting electrode 307 were formed thereon. In this manner, solar cells C-6, C-7, C-8, C-9, and C-10 were prepared. These samples were subjected to the measurement of the initial characteristics as explained before, and then the evaluation of the photodeterioration characteristics in the following manner, as in example 1.

At first, the initial photoelectric conversion efficiency $\eta(0)$ was measured for each sample under irradiation with light of AM-1.5 (100 mW/cm$^2$) from the side of the upper electrode 306. Then an optimum load was calculated from the open-circuit voltage Voc and the short circuit current Isc obtained during the determination of said conversion efficiency, and a load resistor was connected to each sample.

Each sample with connected load resistor was subjected, on a support table maintained at 25° C., to continuous irradiation for 500 hours with light of AM-1.5

(100 mW/cm$^2$), and thereafter the photoelectric conversion efficiency η(500) was determined under irradiation with light of AM-1.5 (100 mW/cm$^2$) from the side of the upper electrode 306 in the same manner as explained above. Based on the thus obtained η(500) and η(0) valves, the deterioration rate {1−(500)/η(0)} was determined.

Figure 11:
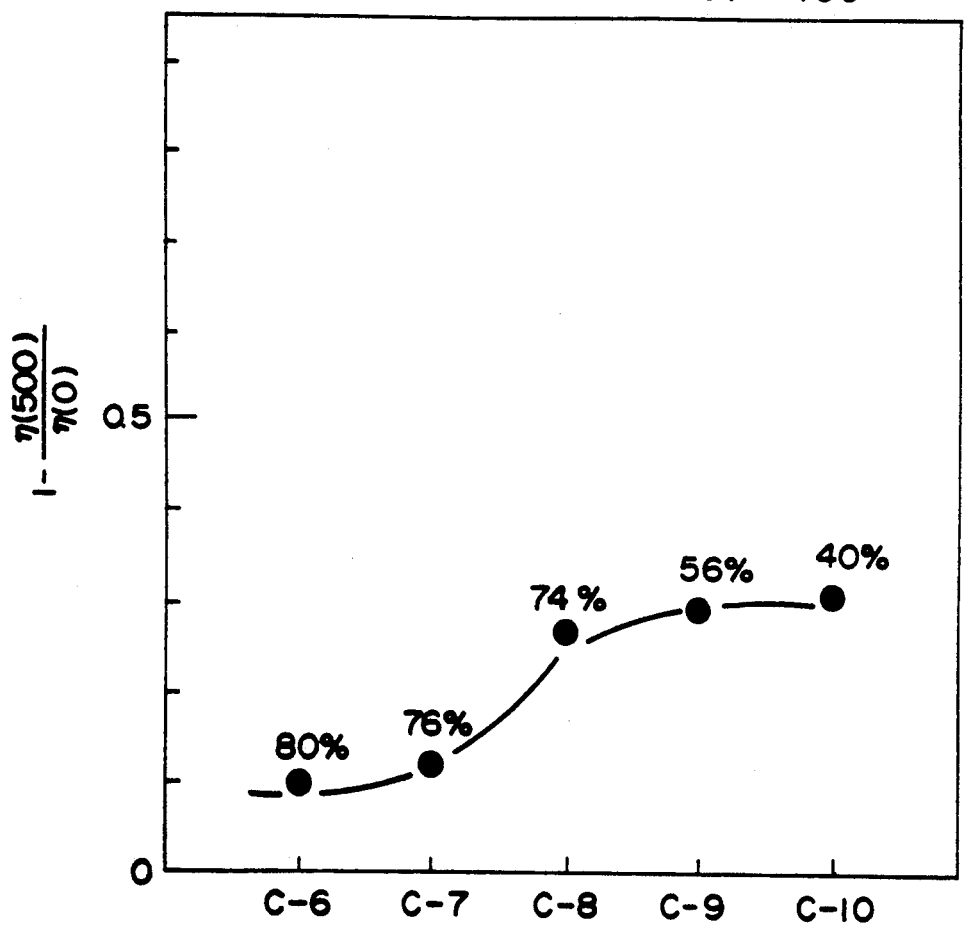
Figure 12:
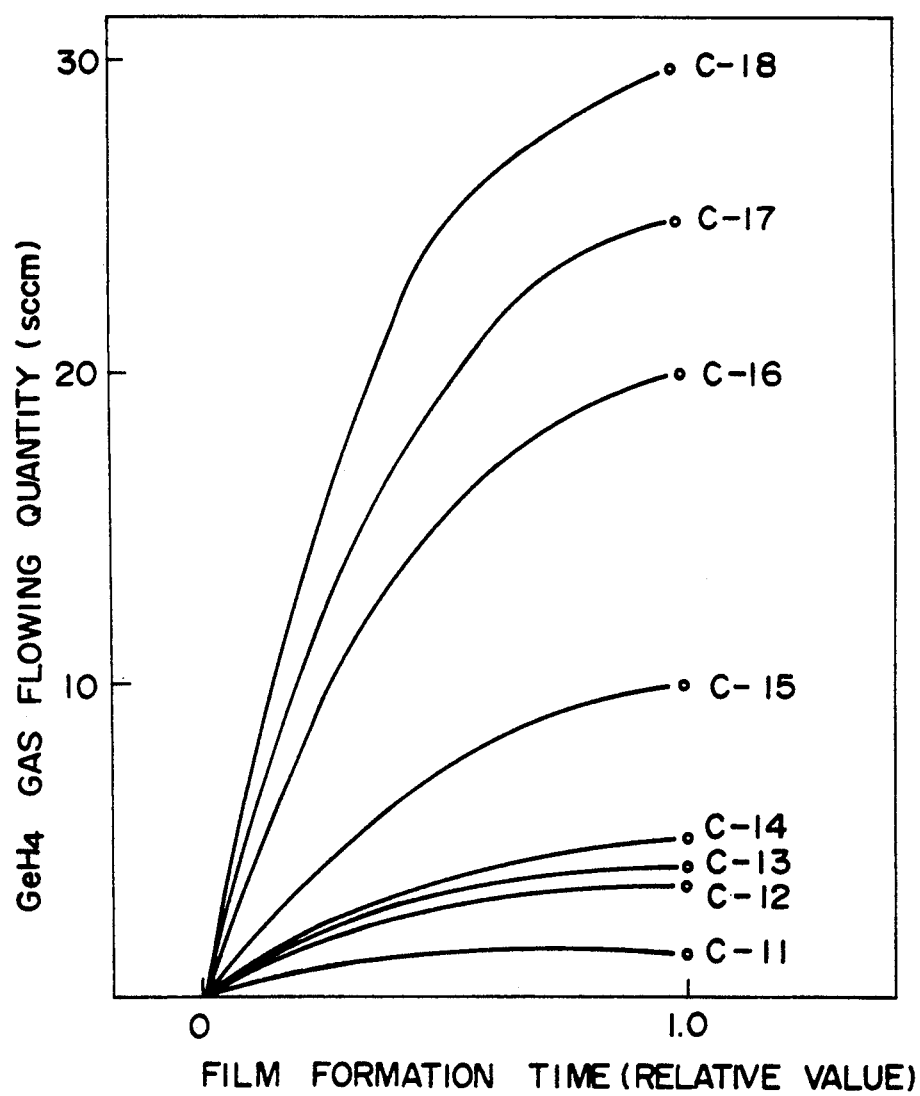
FIG. 12 is a graph showing the gas flow rate profile during formation of the i-layer in the photovoltaic device of the present invention.

As will be apparent from the results shown in FIG. 11, the device is stable to light irradiation if the rate of increase of germanium in the composition ratio is steep at the n-layer side, namely if the rate of increase of germanium is such that the i-layer contains at least 75% of the maximum composition ratio of germanium at the center of the thickness of the i-layer.

EXAMPLE 3

Solar cells of the configuration shown in FIG. 1A, incorporating an i-layer of the band profile shown in FIG. 7, were prepared in a similar manner to the example 1, employing the apparatus shown in FIG. 3, and were subjected to the measurements of electrical properties.

At first, a stainless steel substrate 301, bearing thereon a deposited lower electrode 302, was mounted on the cathode of the reaction chamber 700, which was then sufficiently evacuated. Subsequently, the substrate 301 was heated to 300° C. with the substrate heater 704. After the substrate temperature became constant, an n-layer 303 was deposited with a thickness of 400 Å in the same manner as in example 1. After termination of the gas supply, the reaction chamber 700 was again evacuated, and the valves 770, 772, 730, 732, 740, and 742 were opened to introduce 10 sccm of Si$_2$H$_6$ gas, GeH. gas, and 100 sccm of H$_2$ gas into the reaction chamber 700. The flow rate of the mass flow controller for GeH$_4$ gas was maintained at 0 sccm at the start of film formation. Plasma discharge was induced by supply of a power of 10 W of power from the RF source 707 through the matching box 706 to effect film formation for 20 minutes, during which time the flow rate of the mass flow controller 731 for GeH$_4$ gas was gradually varied to a desired flow rate as indicated by curves C-11 to C-18 in FIG. 12, thereby depositing an amorphous i-silicon-germanium layer 104 of a thickness of ca. 2000 Å, wherein said layer contains germanium in at least 75% of the maximum composition ratio of germanium at the center of thickness of said i-layer.

The maximum composition ratio of germanium in the i-layer in said samples C-11 to C-18 was already known by a separate experiment, as shown in Table 3.

TABLE 3

| GeH$_4$ flow rate (sccm) | Optical band gap (eV) | Ge Composition ratio (%) |
|---|---|---|
| 1 | 1.67 | 11 |
| 3 | 1.58 | 19 |
| 4 | 1.56 | 22 |
| 5 | 1.53 | 28 |
| 10 | 1.38 | 52 |
| 20 | 1.31 | 67 |
| 25 | 1.26 | 72 |
| 30 | 1.25 | 75 |

Then the supply of GeH$_4$ was terminated, as in example 1 and the film formation was continued with Si$_2$H$_6$ gas and H$_2$ gas, thereby depositing a buffer layer with a thickness of 300 Å. Then the RF discharge was terminated together with the gas supply, the reaction chamber 700 was again evacuated, and SiH$_4$ gas and B$_2$H$_6$ gas were introduced to deposit a p-layer 305 with a thickness of 200 Å in the same manner as in example 1. Subsequently, the substrate was placed in another deposition apparatus, and a transparent ITO film of a thickness of 700 Å, constituting the upper electrode 306, was deposited. The sample was then separated into sub cells of a size of 1×1 cm by etching, and a current-collecting electrode 307 was formed by electron beam evaporation in another evaporation apparatus.

Each of the obtained samples C-11 to C-18 was then subjected to measurement of the initial conversion efficiency η(0) through the determination of voltage-current characteristics under irradiation with the light of a solar simulator (AM-1.5, 100 mW/cm$^2$), and also to measurement of the conversion efficiency η(500) after continuous irradiation for 500 hours with the light of AM-1.5 (100 mW/cm$^2$) in the same manner as in the example 2. Based on the thus obtained η(500) and η(0) values, the deterioration rate {1−(500)/η(0)} was determined.

Figure 13:
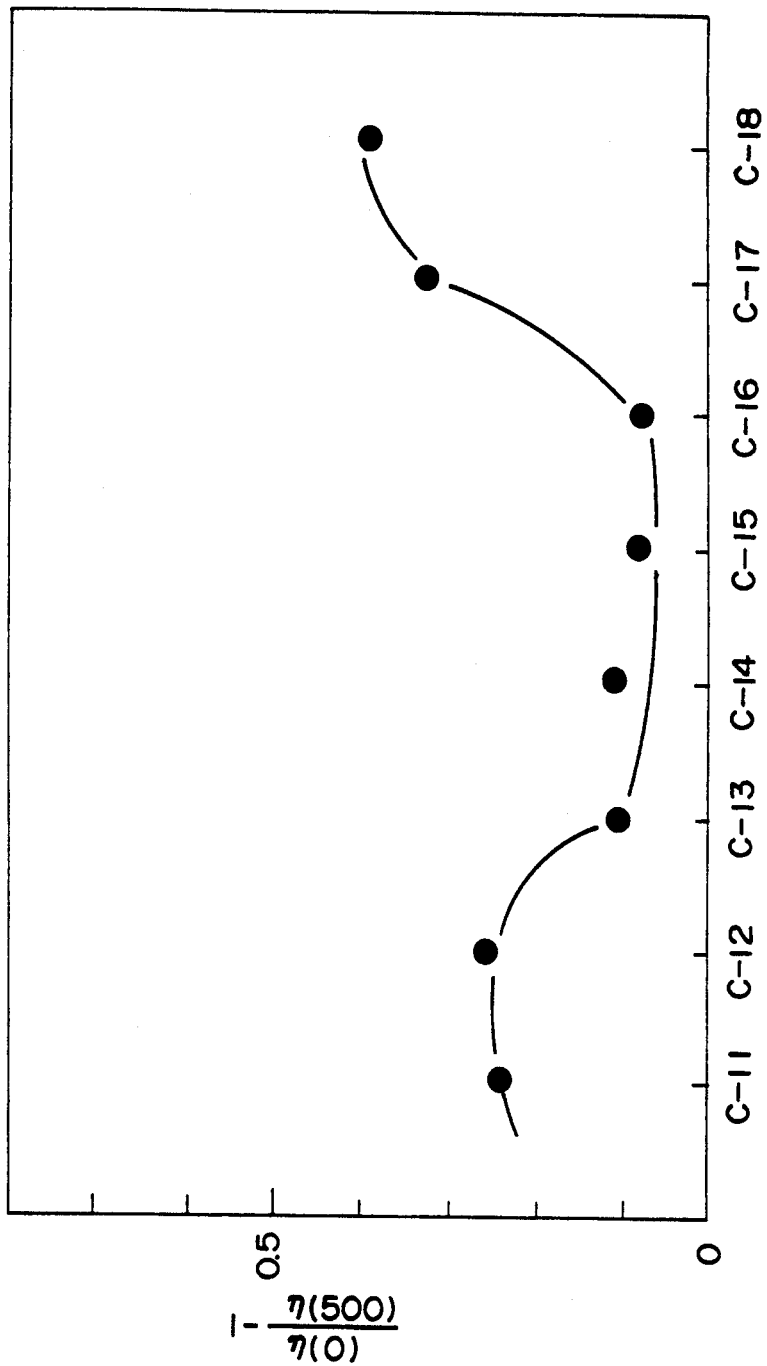
FIG. 13 is a graph showing changes in characteristics due to photodeterioration in the photovoltaic device of the present invention.

As will be apparent from the results shown in FIG. 13, the time-dependent deterioration of solar cell is less when the composition ratio of germanium is within a range from 20 to 70 at. %, than in other ranges.

EXAMPLE 4

Solar cells of the configuration shown in FIG. 1A, incorporating an i-layer -of the band profile shown in FIG. 7, were prepared in a similar manner to sample 1, subjected to the measurements of electrical properties.

At first, a quartz glass 301 of 5 cm square form, the surface of which was mirror polished to Rmax of 0.01 μm, was subjected, in an evaporation apparatus (not shown), to the deposition of a SnO, film of a thickness of 3000 Å as the upper electrode 306. Then the substrate was mounted on the cathode of the reaction chamber 700, the interior of which was then sufficiently evacuated with the vacuum pump 709, until the pressure measured with an ion gauge reached 10$^{-6}$ Torr. Then the substrate was heated to 300° C. by the substrate heater 704. After the substrate temperature became constant, a microcrystalline p-silicon layer 305 was deposited with a thickness of 100 Å in the same manner as in example 1. After the gas supply was terminated, the reaction chamber 700 was again evacuated to a pressure of 10$^{-6}$ Torr, then 10 sccm of Si$_2$H$_6$ gas and 100 sccm of H$_2$ gas were introduced into the reaction chamber 700 and a power of 10 W was supplied from the RF source 707 to deposit a buffer layer of a thickness of 300 Å.

Figure 14:
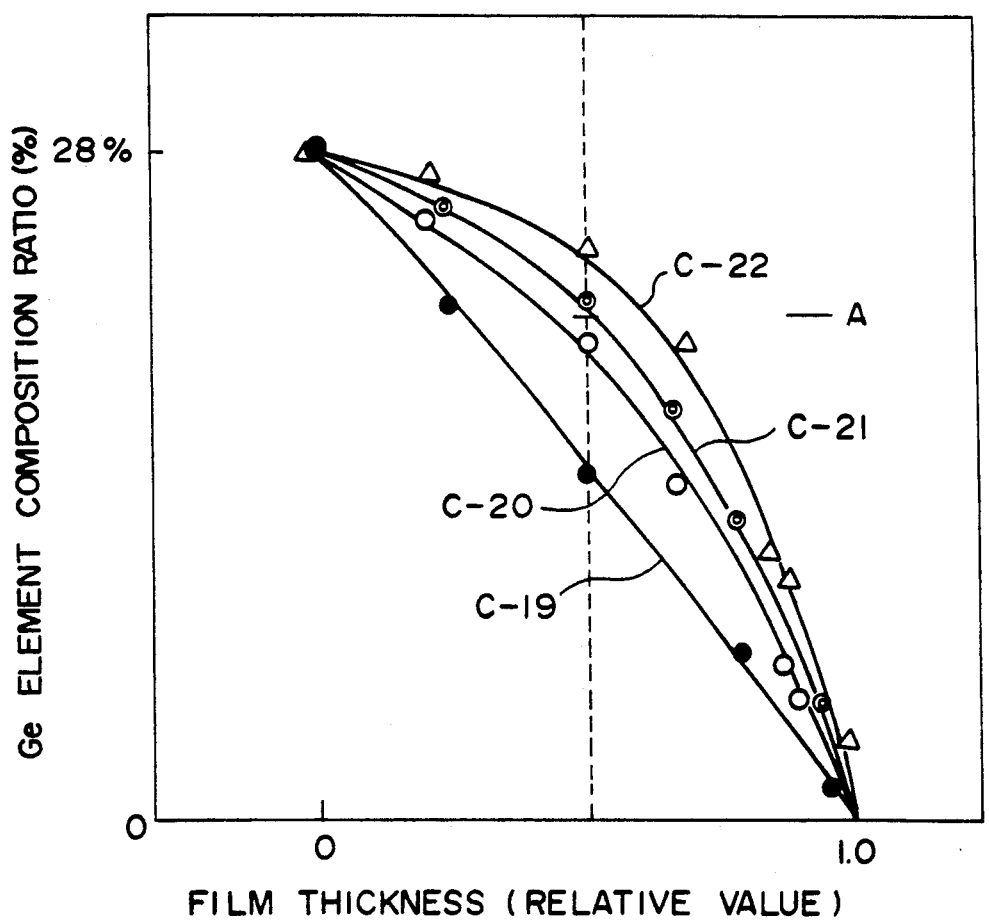
FIG. 14 is a graph showing the relation between the composition ratio of germanium in the i-layer of the photovoltaic device of the present invention and the film thickness.

Then, with the supply of Ge$_4$ gas at 5 sccm, an RF power of 10 W was supplied to induce plasma discharge, and an amorphous i-silicon-germanium layer 304 was deposited with a thickness of ca. 2000 Å, during which time the flow rate of GeH gas was gradually varied to 0 sccm so as to obtain a Ge composition profile shown by C-19 in FIG. 14. A solar cell was completed by then depositing an n-layer 303.

Similarly, solar cells were prepared with the Ge profiles represented by C-20 to C-22 in FIG. 14. In FIG. 14, point A corresponds to 75% of the maximum composition ratio of germanium, so that the samples C-21 and C-22 contain germanium in an amount at least equal to 75% of the maximum composition ratio of germanium, at the center of the thickness of the i-layer.

After cooling, the substrate was taken out from the reaction chamber 700 and placed in a resistance-heated evaporation apparatus, in which aluminum was deposited with a thickness of 5000 Å for constituting a lower electrode 302. Subsequently, the substrate was separated into sub cells of a size of 1×1 cm in an etching apparatus (not shown). Solar cells C-19 to C-22 were obtained in this manner.

Each of the obtained samples was subjected to the measurement of the initial conversion efficiency $\eta(0)$ through the determination of voltage-current characteristics under the irradiation with the light of a solar simulator (AM-1.5, 100 mW/cm$^2$), and also to the measurement of conversion efficiency $\eta(500)$ after continuous irradiation for 500 hours with the light of AM-1.5 (100 mW/cm$^2$) in the same manner as in example 2. Based on thus obtained $\eta(500)$ and $\eta(0)$ values, the deterioration rate $\{1-(500)/\eta(0)\}$ was determined.

Figure 15:
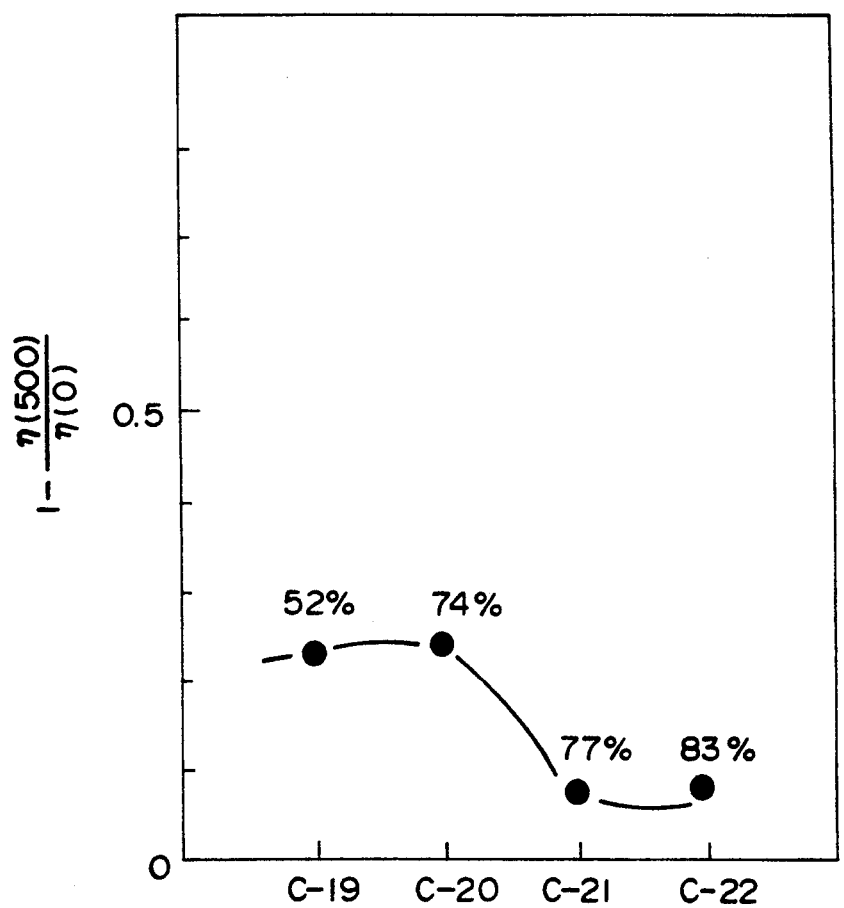
FIG. 15 is a graph showing changes in characteristics by photodeterioration in the photovoltaic device of the present invention.

As will be apparent from the results shown in FIG. 15, the time-dependent deterioration of the solar cell is reduced when the composition ratio of germanium, within a range from 20 to 70 at. %, has a steeper rate of increase at the n-layer side, in such a manner that the germanium composition ratio at the center of thickness of the i-layer is at least equal to 75% of the maximum composition ratio of germanium.

As explained in the foregoing, the present invention provides a solar cell with satisfactory initial conversion efficiency and with reduced time-dependent deterioration of the conversion efficiency, said solar cell being characterized by an i-semiconductor layer, positioned at the center of a pin photovoltaic device, which has a profile in the composition ratio of germanium from the side of n-layer to the side of p-layer, such that the rate of increase of said composition ratio of germanium is larger at the n-layer side and smaller at the p-layer side in such a manner that the composition ratio of germanium at the center of thickness of said i-semiconductor layer is at least equal to 75% of the maximum composition ratio in said i-semiconductor layer, and that the maximum composition ratio of germanium in said i-semiconductor layer is within a range from 20 to 70 atom. %.

What is claimed is:

1. A photovoltaic device having a non-monocrystalline semiconductor body with a pin junction therein, wherein said semiconductor body comprises silicon atoms, an i-type semiconductor layer comprising a region containing germanium and at least one region substantially not containing germanium; said at least one region not containing germanium being positioned at least at the side of a p-type semiconductor layer; the maximum composition ratio of germanium in said region containing germanium is within a range from 20 to 70 at. %; the composition ratio of germanium in said region containing germanium is zero at the side of an n-type semiconductor layer and increases toward the side of said p-type semiconductor layer, with a rate of increase larger at the side of said n-type semiconductor layer than at the side of said p-type semiconductor layer; the composition ratio of germanium at the central position in the thickness of the i-type layer is at least equal to 75 at. % of the maximum composition ratio of germanium; the maximum composition ratio of germanium being achieved at the interface of said p-type semiconductor layer with the region of the i-type layer containing the germanium; and the energy band gap of the region substantially not including the germanium being narrower than the energy band gap of the p-type semiconductor layer but being wider than the energy band gap of the region including germanium, and light is incident said p-type semiconductor layer.

2. A photovoltaic device according to claim 1, wherein the bandgap of the i-type layer at the p-type and i-type layer interface is substantially smaller than the band gap of the n-type layer.

* * * * *

UNITED STATES PATENT AND TRADEMARK OFFICE
CERTIFICATE OF CORRECTION

PATENT NO. : 5,279,681

DATED : January 18, 1994

INVENTOR(S) : KOICHI MATSUDA, ET AL.                    Page 1 of 4

It is certified that error appears in the above-identified patent and that said Letters Patent is hereby corrected as shown below:

ON TITLE PAGE

In [54] Title: "THERIN" should read --THEREIN--.

In [57] Abstract:
      Line 18, "of" (second occurrence) should read --of the--.

IN THE DRAWINGS

Sheet 14 of 14, FIG. 15:
      "MIDST ACROSS" should read --CENTER OF--.

COLUMN 1

Line 3, "THERIN" should read --THEREIN--.
    Line 25, "load" should read --load.--.
    Line 41, "drawbacks;" should read --drawbacks,--.
    Line 43, "an" should be deleted.

COLUMN 2

Line 4, "GaAIAs." should read --GaAlAs.--.
    Line 16, "1 7 eV," should read --1.7 eV,--.

COLUMN 5

Line 13, "resin.," should read --resin,--.

COLUMN 6

Line 46, "$CdSnO_2$," should read --$CdSnO_4$,--.

UNITED STATES PATENT AND TRADEMARK OFFICE
CERTIFICATE OF CORRECTION

PATENT NO. : 5,279,681

DATED : January 18, 1994

INVENTOR(S) : KOICHI MATSUDA, ET AL.

It is certified that error appears in the above-identified patent and that said Letters Patent is hereby corrected as shown below:

COLUMN 7

Line 31, "poly-Si. H," should read --poly-Si:H,--.
Line 32, "Gruop III-V" should read --Group III-V--.
Line 63, "Group compounds" should read --Group III elements include B, Al, Ga, and In. Examples of the compounds--.
Line 68, "Ga(OCH$_3$," should read --Ga(OCH$_3$)$_3$,--.

COLUMN 8

Line 10, "P(C$_3$H$_{73}$," should read --P(C$_3$H$_7$)$_3$,--.
Line 20, "by" should read --by a--.

COLUMN 9

Line 37, "300°" should read --300°C.--.
Line 47, "GeH" should read --GeH$_4$--.
Line 58, "GeH." should read --GeH$_4$--.

COLUMN 10

Line 67, "Hz gas." should read --H$_2$ gas.--.

COLUMN 11

Line 22, "SiH gas," should read --SiH$_4$ gas,--.

COLUMN 14

Line 46, "GeH" should read --GeH$_4$--.

UNITED STATES PATENT AND TRADEMARK OFFICE
CERTIFICATE OF CORRECTION

PATENT NO. : 5,279,681

DATED : January 18, 1994

INVENTOR(S) : KOICHI MATSUDA, ET AL.

Page 3 of 4

It is certified that error appears in the above-identified patent and that said Letters Patent is hereby corrected as shown below:

COLUMN 15

Line 11, "Hz gas" should read --$H_2$ gas--.
Line 12, "$H_2$gas" should read --$H_2$ gas--.

COLUMN 16

Line 20, "{1−↓(500/η(0))}" should read --{1−η(500/η(0))}--.
Line 25, "side" should read --side,--.
Line 44, "GeH" should read --$GeH_4$--.

COLUMN 17

Line 6, "{1−(500/η(0))}" should read --{1−η(500/η(0))}--.
Line 33, "GeH. gas," should read --$GeH_4$ gas,--.

COLUMN 18

Line 18, "{1−(500/η(0))}" should read --{1−η(500/η(0))}--.
Line 27, "-of" should read --of--.
Line 28, "sample 1," should read --sample 1, employing the apparatus shown in FIG. 3, and were--.
Line 33, "SnO," should read --$SnO_2$,--.
Line 50, "$Ge_4$ gas" should read --$GeH_4$ gas--.
Line 54, "GeH gas" should read --$GeH_4$ gas--.

COLUMN 19

Line 15, "{1−(500/η(0))}" should read --{1−η(500/η(0))}--.

UNITED STATES PATENT AND TRADEMARK OFFICE
CERTIFICATE OF CORRECTION

PATENT NO.  : 5,279,681
DATED       : January 18, 1994
INVENTOR(S) : KOICHI MATSUDA, ET AL.

It is certified that error appears in the above-identified patent and that said Letters Patent is hereby corrected as shown below:

<u>COLUMN 20</u>

Line 34, "p-type" should read --p-type layer--.

Signed and Sealed this

Twentieth Day of September, 1994

Attest:

BRUCE LEHMAN

Attesting Officer                Commissioner of Patents and Trademarks